US012749528B2

(12) United States Patent
Jordan et al.

(10) Patent No.: US 12,749,528 B2
(45) Date of Patent: Sep. 29, 2026

(54) SCANNABLE SRAM

(71) Applicant: SambaNova Systems, Inc., Palo Alto, CA (US)

(72) Inventors: Paul Jordan, Austin, TX (US); Thomas Ziaja, Austin, TX (US)

(73) Assignee: SambaNova Systems, Inc., San Jose, CA (US)

( * ) Notice: Subject to any disclaimer, the term of this patent is extended or adjusted under 35 U.S.C. 154(b) by 0 days.

(21) Appl. No.: 19/385,911

(22) Filed: Nov. 11, 2025

(65) Prior Publication Data

US 2026/0134908 A1 May 14, 2026

Related U.S. Application Data

(60) Provisional application No. 63/719,082, filed on Nov. 11, 2024.

(51) Int. Cl.
*G11C 11/417* (2006.01)
*G11C 11/41* (2006.01)
*G11C 29/32* (2006.01)

(52) U.S. Cl.
CPC ............ *G11C 11/417* (2013.01); *G11C 11/41* (2013.01); *G11C 29/32* (2013.01); *G11C 2029/3202* (2013.01)

(58) Field of Classification Search
CPC ....... G11C 11/417; G11C 11/41; G11C 29/32; G11C 2029/3202
See application file for complete search history.

(56) References Cited

U.S. PATENT DOCUMENTS

| | | | |
|---|---|---|---|
| 4,293,919 | A | 10/1981 | Dasgupta et al. |
| 5,550,843 | A | 8/1996 | Yee |
| 6,115,836 | A | 9/2000 | Churchill et al. |
| 6,519,729 | B1 | 2/2003 | Whetsel |

(Continued)

FOREIGN PATENT DOCUMENTS

WO 2010142987 A1 12/2010

OTHER PUBLICATIONS

M. Emani et al., Accelerating Scientific Applications With Sambanova Reconfigurable Dataflow Architecture, in Computing in Science & Engineering, vol. 23, No. 2, pp. 114-119, Mar. 26, 2021, [doi: 10.1109/MCSE.2021.3057203].

(Continued)

*Primary Examiner* — Amir Zarabian
*Assistant Examiner* — Justin Bryce Heisterkamp
(74) *Attorney, Agent, or Firm* — FP; Sikander M. Khan; Andre Henri Grouwstra

(57) ABSTRACT

A scannable memory cell includes an amplifier configured in a positive feedback loop, with the amplifier output coupled to the scan output SO terminal. The memory cell further has a data access switch coupled between the amplifier output and the bit line BL terminal, and a scan access switch coupled between the amplifier input and the scan input SI terminal. Control terminals of both switches are coupled to the word line WL and scan control SC line terminals, respectively. Some implementations further include a scan loop switch, controlled by the scan control SC terminal, and configured to interrupt the positive feedback loop when the memory cell is in scan mode. Other implementations include a scan out SO buffer or inverter with increased drive strength.

9 Claims, 12 Drawing Sheets

Scannable SRAM cell

(56) References Cited

U.S. PATENT DOCUMENTS

| | | | | |
|---|---|---|---|---|
| 6,546,505 | B1 | 4/2003 | Swoboda et al. | |
| 7,474,574 | B1 * | 1/2009 | Agarwal | G11C 29/32 365/201 |
| 7,565,597 | B1 * | 7/2009 | Branth | G06F 11/1032 714/763 |
| 8,553,482 | B2 | 10/2013 | Chow | |
| 10,162,005 | B1 | 12/2018 | Alzheimer | |
| 11,443,822 | B2 | 9/2022 | Ziaja et al. | |
| 11,443,823 | B2 | 9/2022 | Ziaja et al. | |
| 11,961,575 | B2 | 4/2024 | Ziaja et al. | |
| 2004/0004898 | A1 * | 1/2004 | Kim | G11C 8/16 365/230.03 |
| 2004/0120209 | A1 * | 6/2004 | Lee | G11C 8/16 365/185.05 |
| 2004/0151041 | A1 * | 8/2004 | Lee | G11C 11/4125 257/E27.098 |
| 2004/0190331 | A1 | 9/2004 | Ross et al. | |
| 2008/0091995 | A1 * | 4/2008 | Baik | G01R 31/318541 714/726 |
| 2008/0155362 | A1 * | 6/2008 | Chang | G11C 29/50 714/718 |
| 2012/0072793 | A1 * | 3/2012 | Rao | G11C 29/32 714/719 |
| 2016/0189769 | A1 * | 6/2016 | Jeloka | G11C 15/04 365/154 |
| 2017/0115342 | A1 | 4/2017 | Wang | |
| 2020/0043554 | A1 * | 2/2020 | Moriwaki | G11C 15/04 |
| 2022/0139478 | A1 * | 5/2022 | Ziaja | G11C 29/32 714/726 |
| 2022/0148649 | A1 * | 5/2022 | Mohammadi | G11C 5/145 |
| 2023/0010087 | A1 * | 1/2023 | Chen | G11C 11/412 |

OTHER PUBLICATIONS

Podobas et al, A Survey on Coarse-Grained Reconfigurable Architectures From a Performance Perspective, IEEEAccess, vol. 2020. 3012084, Jul. 27, 2020, 25 pages.

* cited by examiner

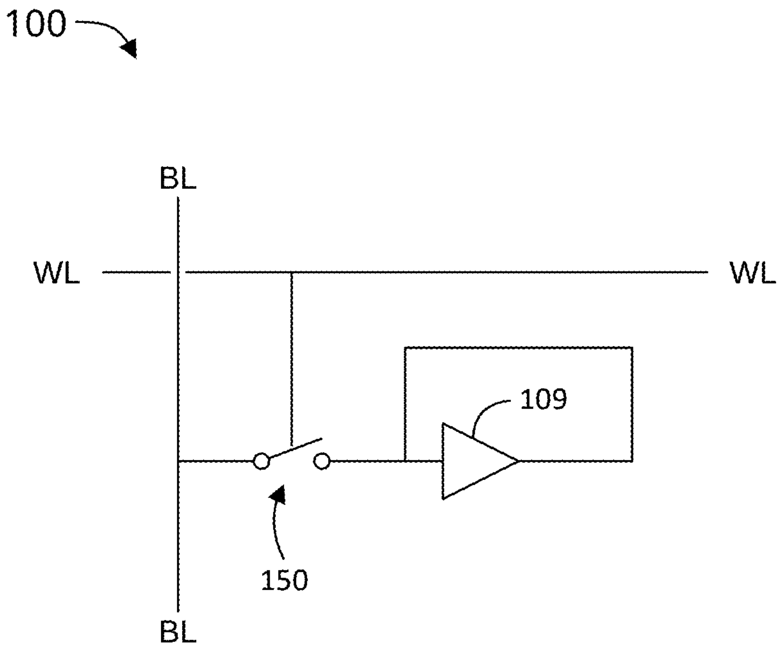
FIG. 1 – PRIOR ART

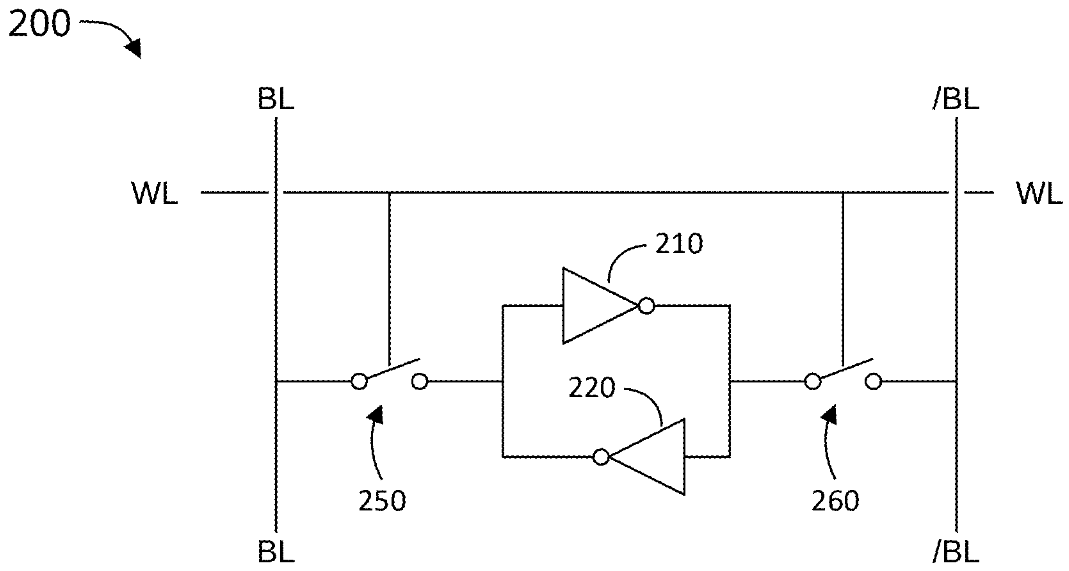
FIG. 2 – PRIOR ART
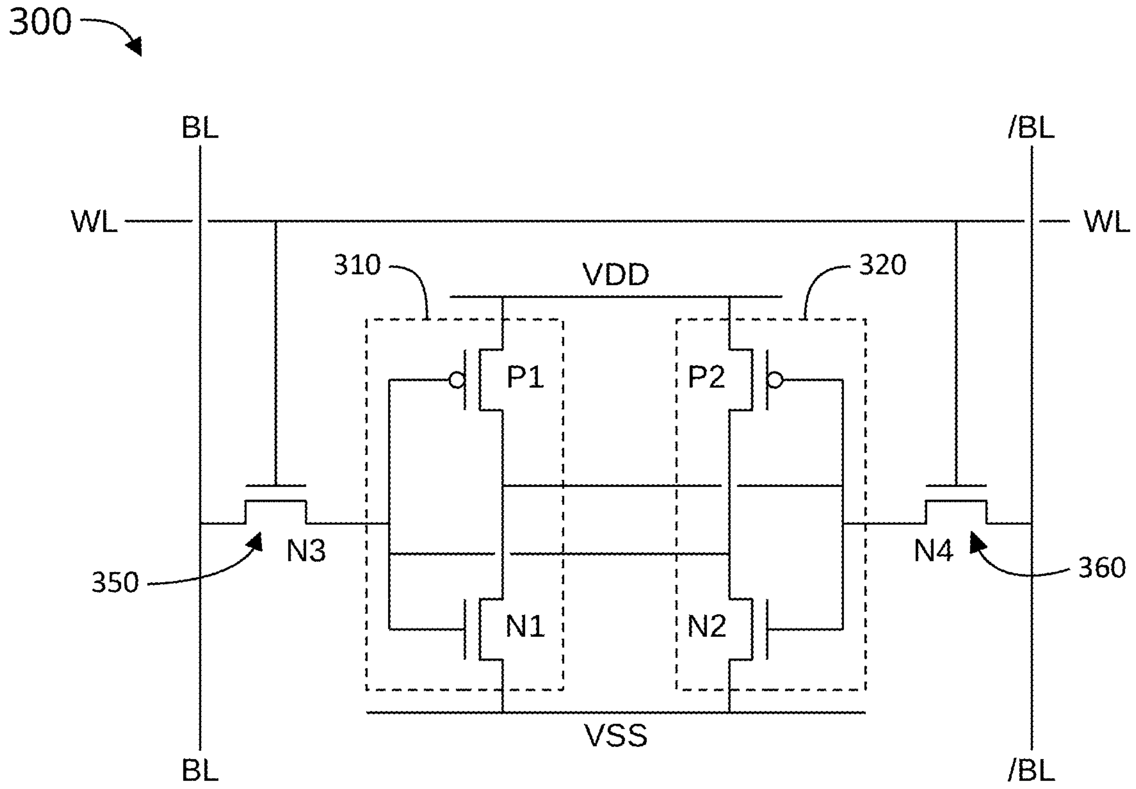
FIG. 3 – PRIOR ART

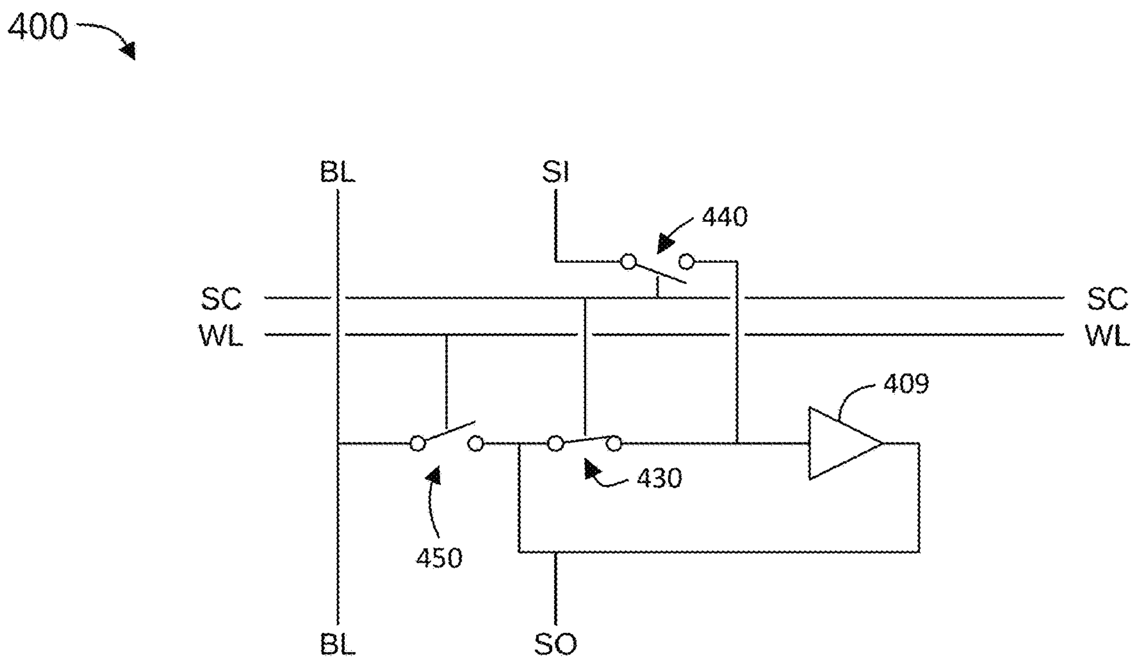
FIG. 4 - Scannable SRAM cell
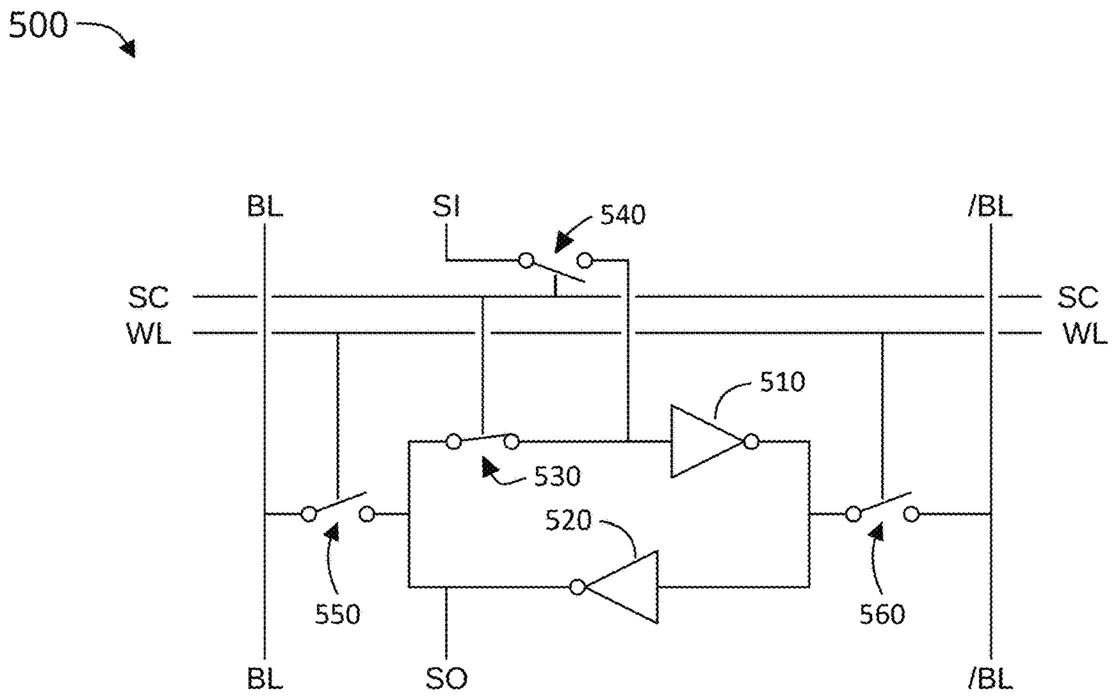
FIG. 5 - Scannable SRAM cell

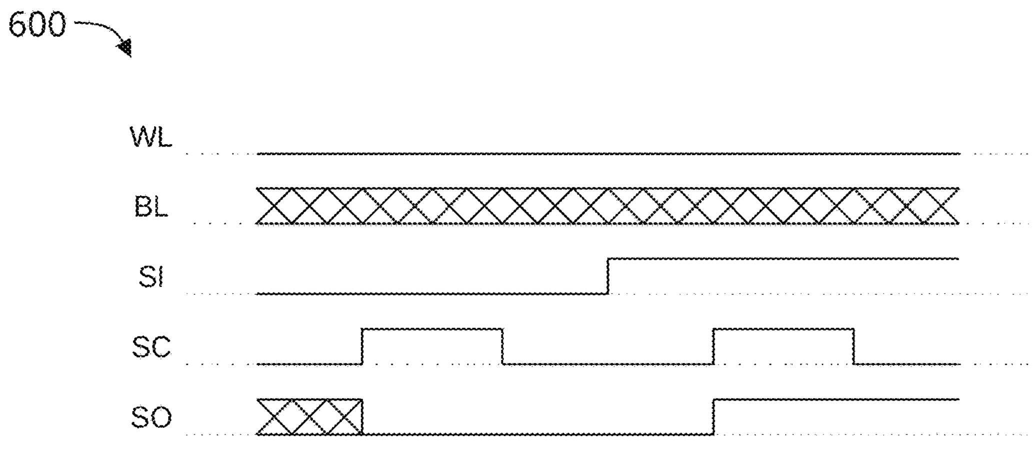
FIG. 6 - Scan mode timing
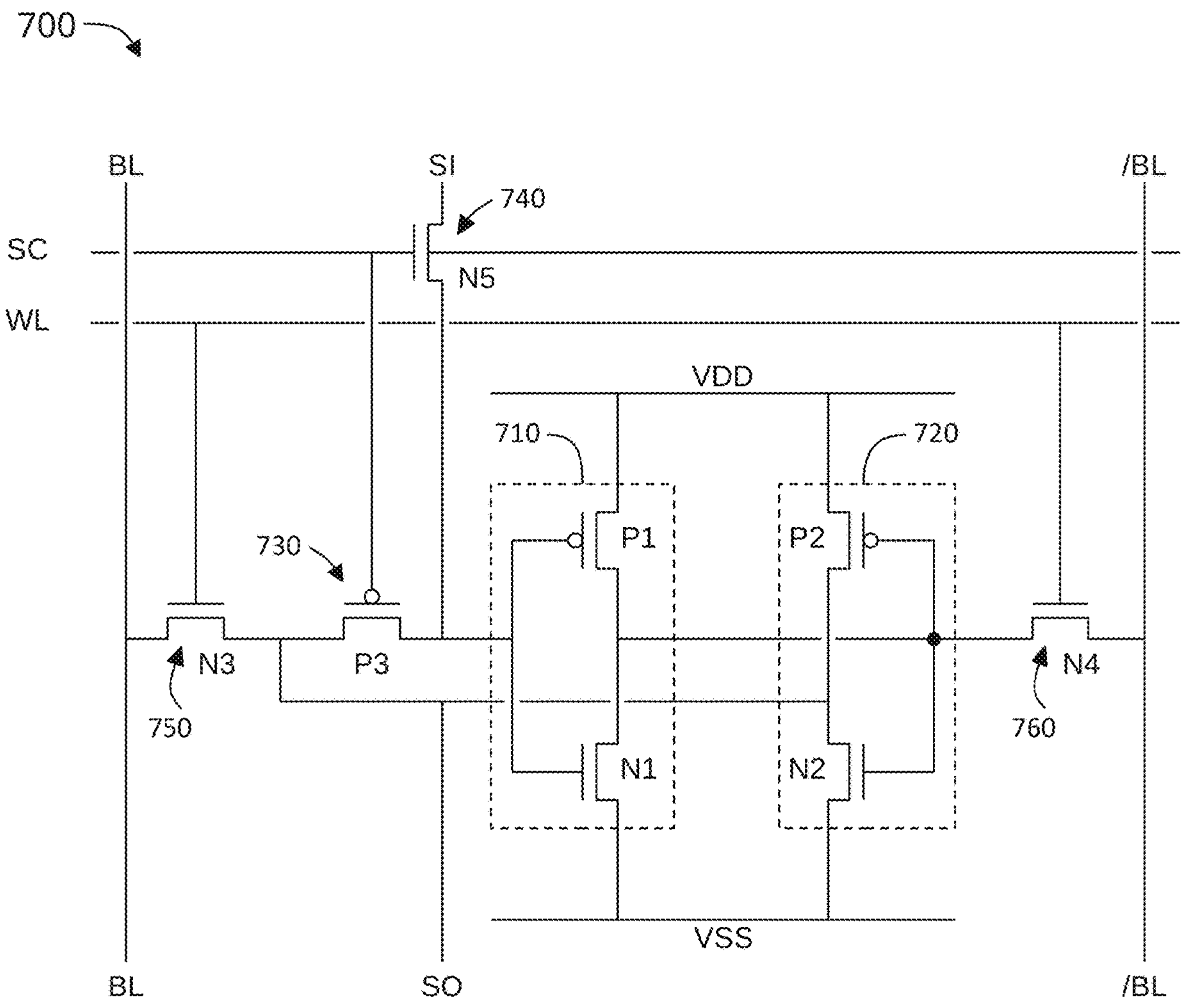
FIG. 7 - Scannable SRAM cell

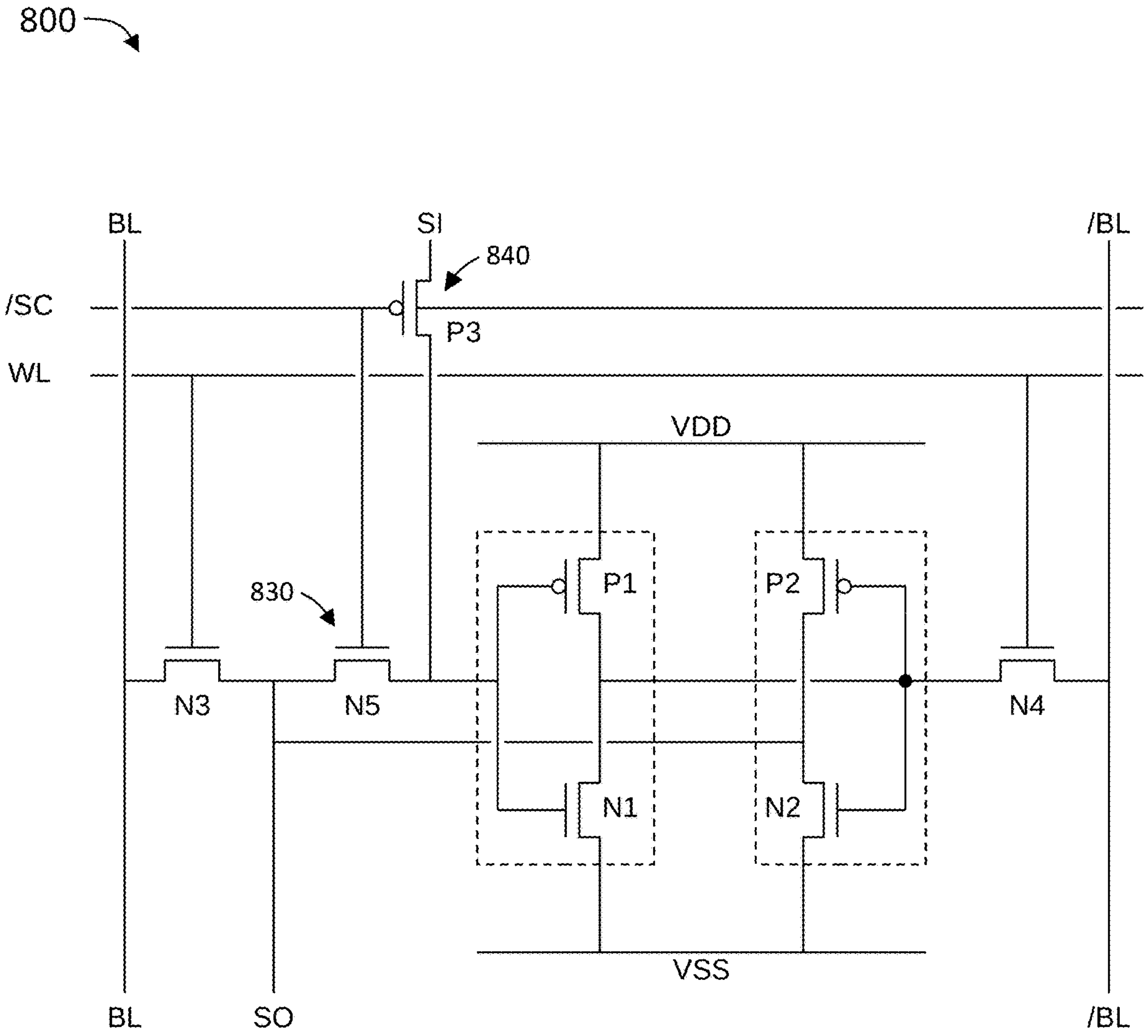
FIG. 8 - Scannable SRAM cell

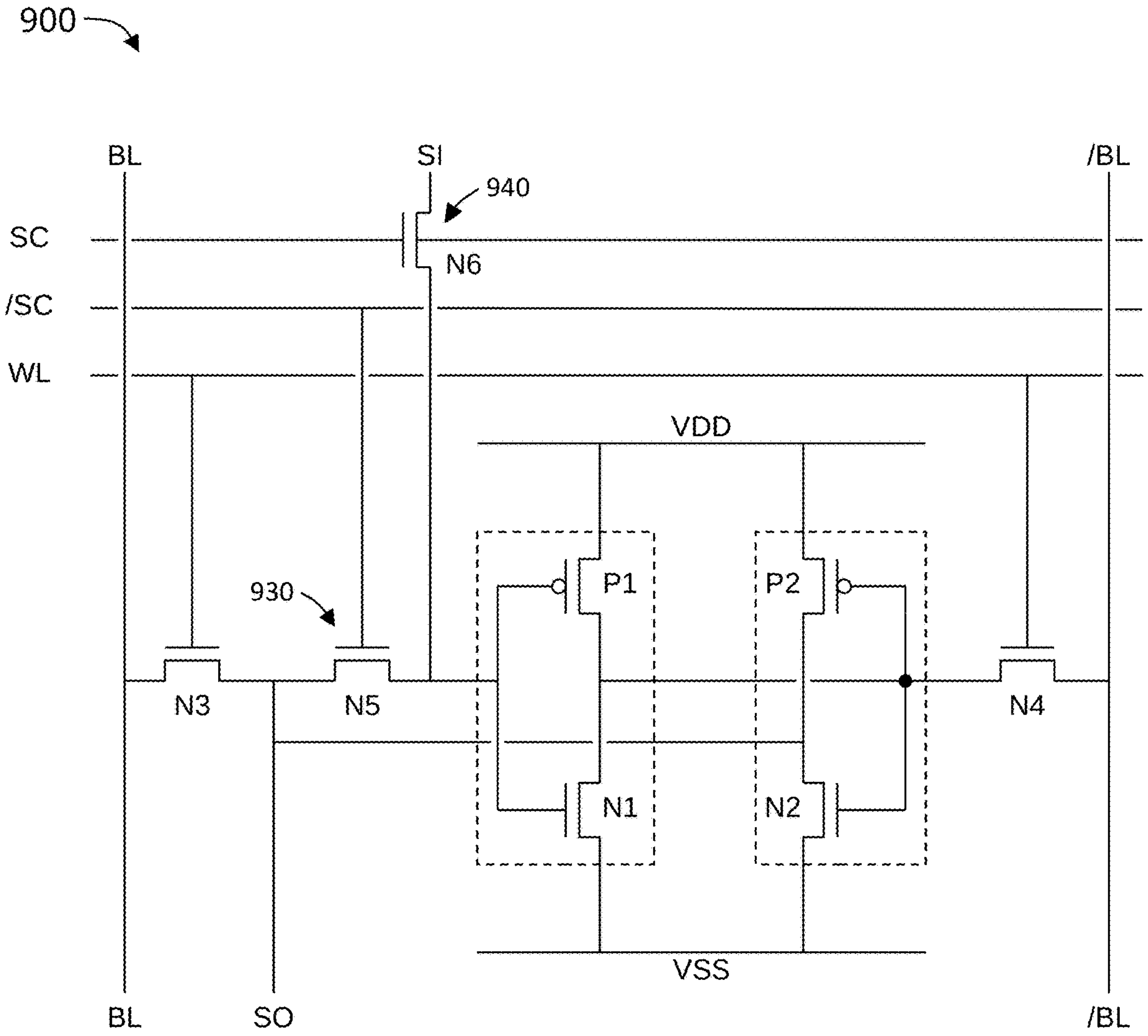
FIG. 9 - Scannable SRAM cell

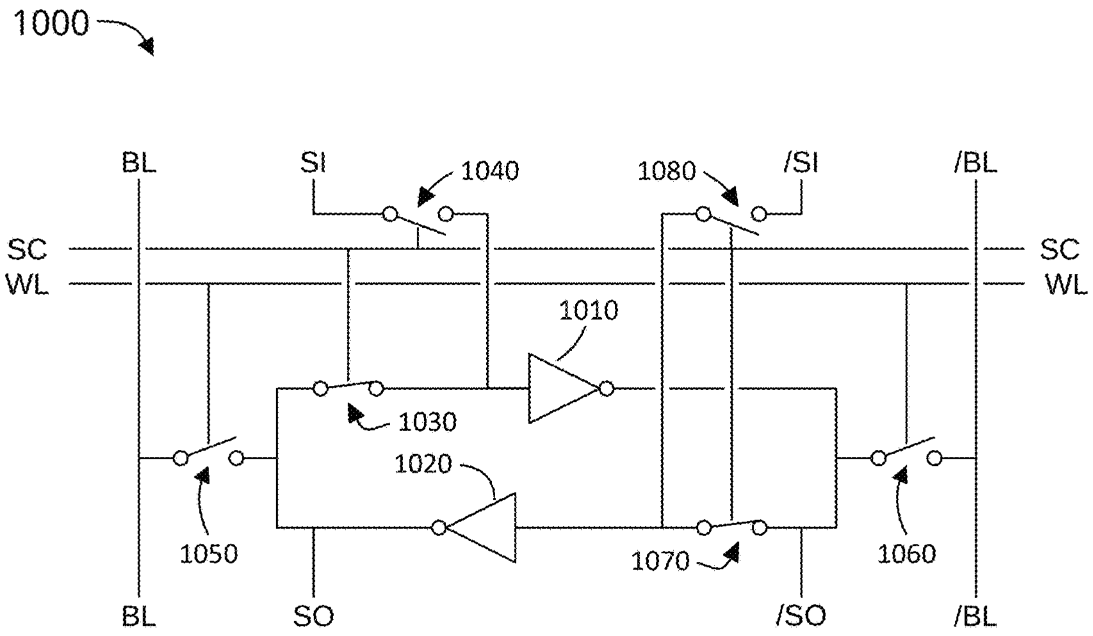
FIG. 10 - Scannable SRAM cell
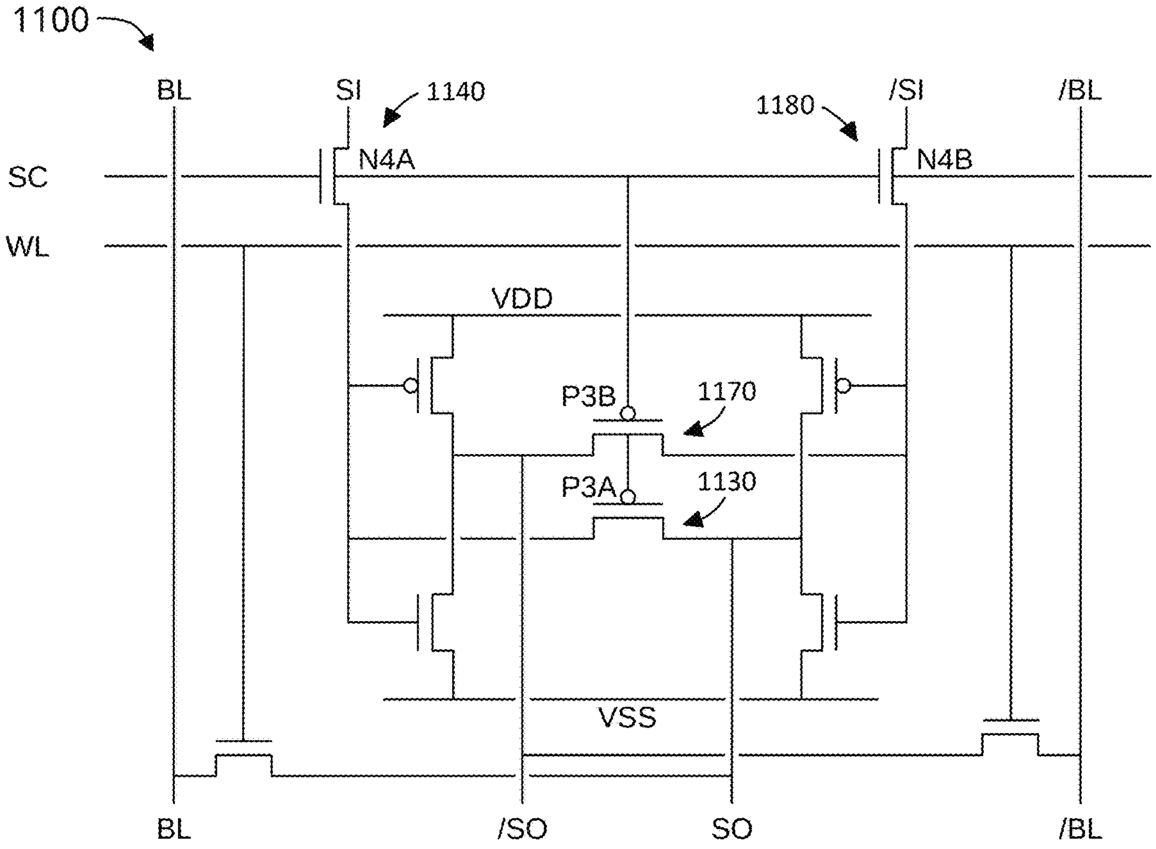
FIG. 11 - Scannable SRAM cell

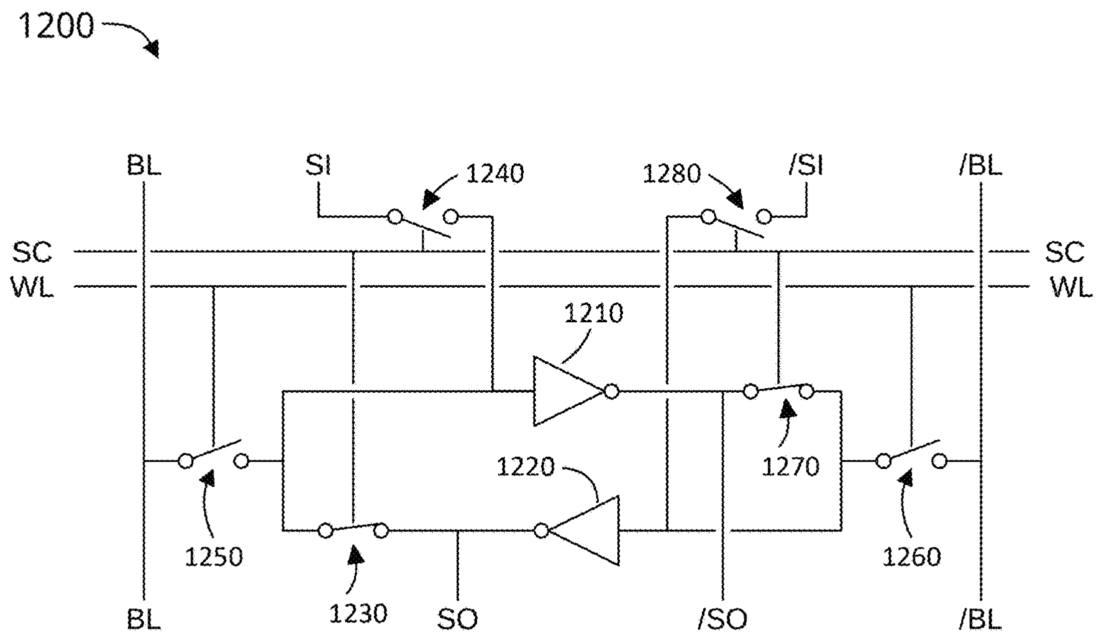
FIG. 12 - Scannable SRAM cell
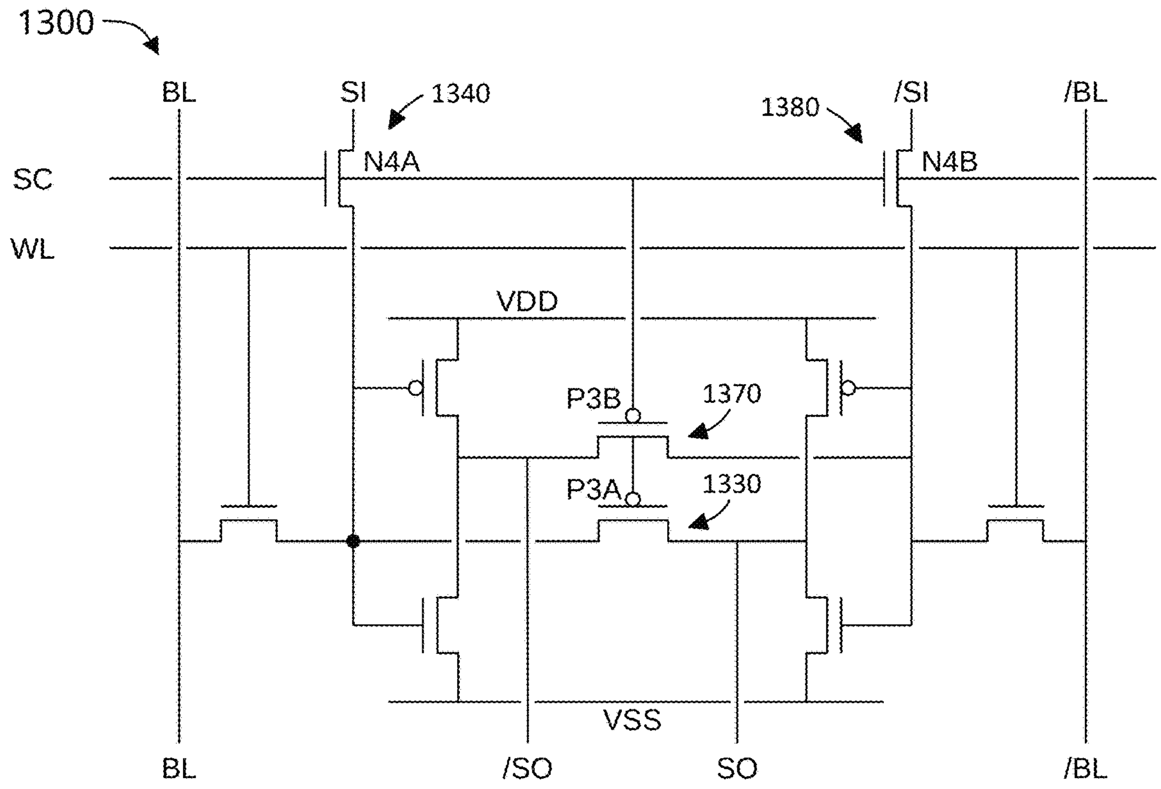
FIG. 13 - Scannable SRAM cell

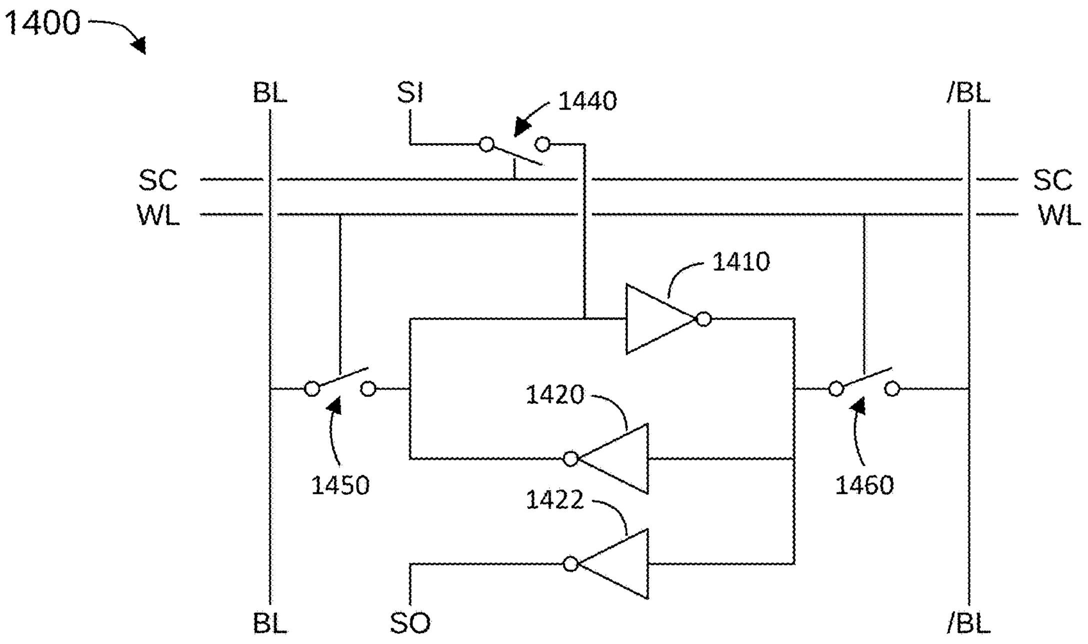
FIG. 14 - Scannable SRAM cell
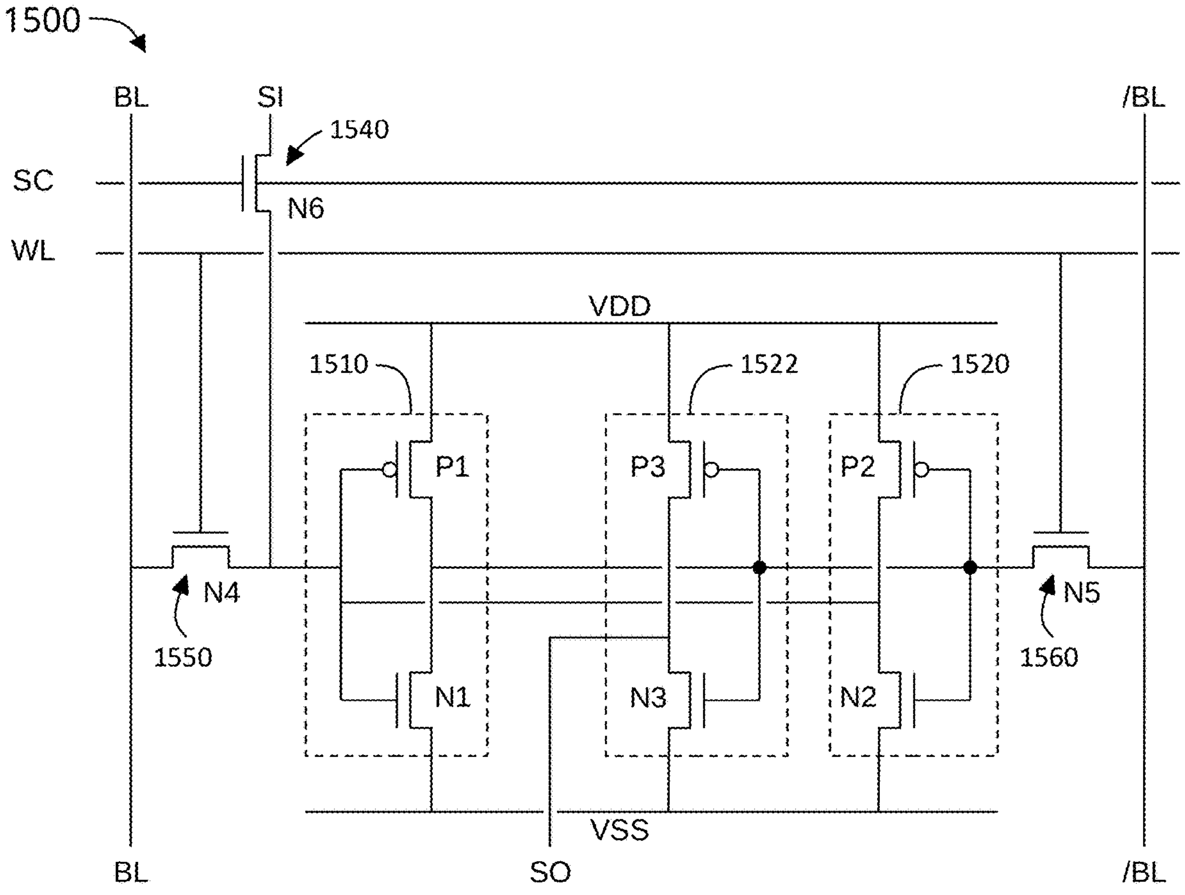
FIG. 15 - Scannable SRAM cell

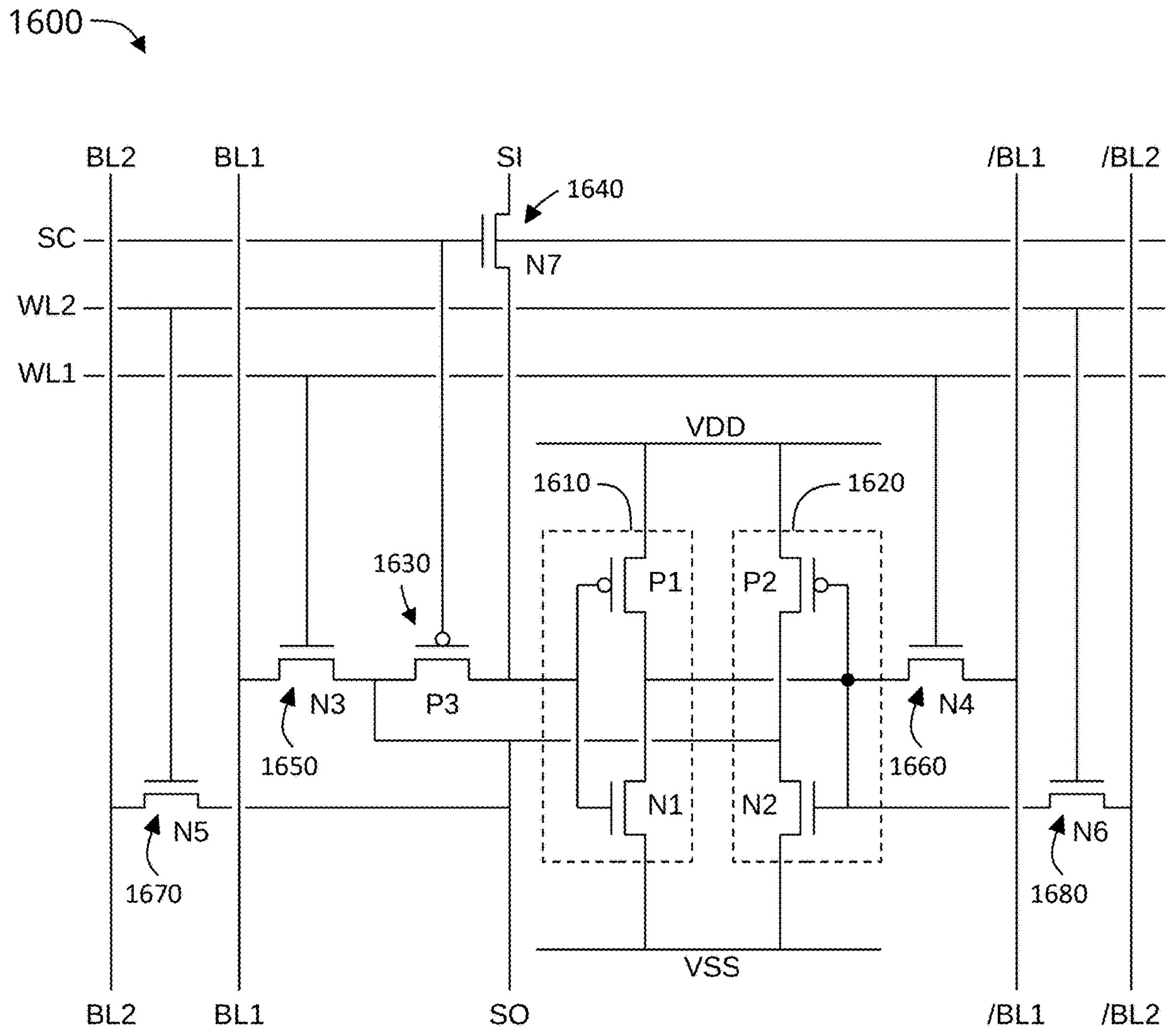
FIG. 16 - Scannable dual-port SRAM cell

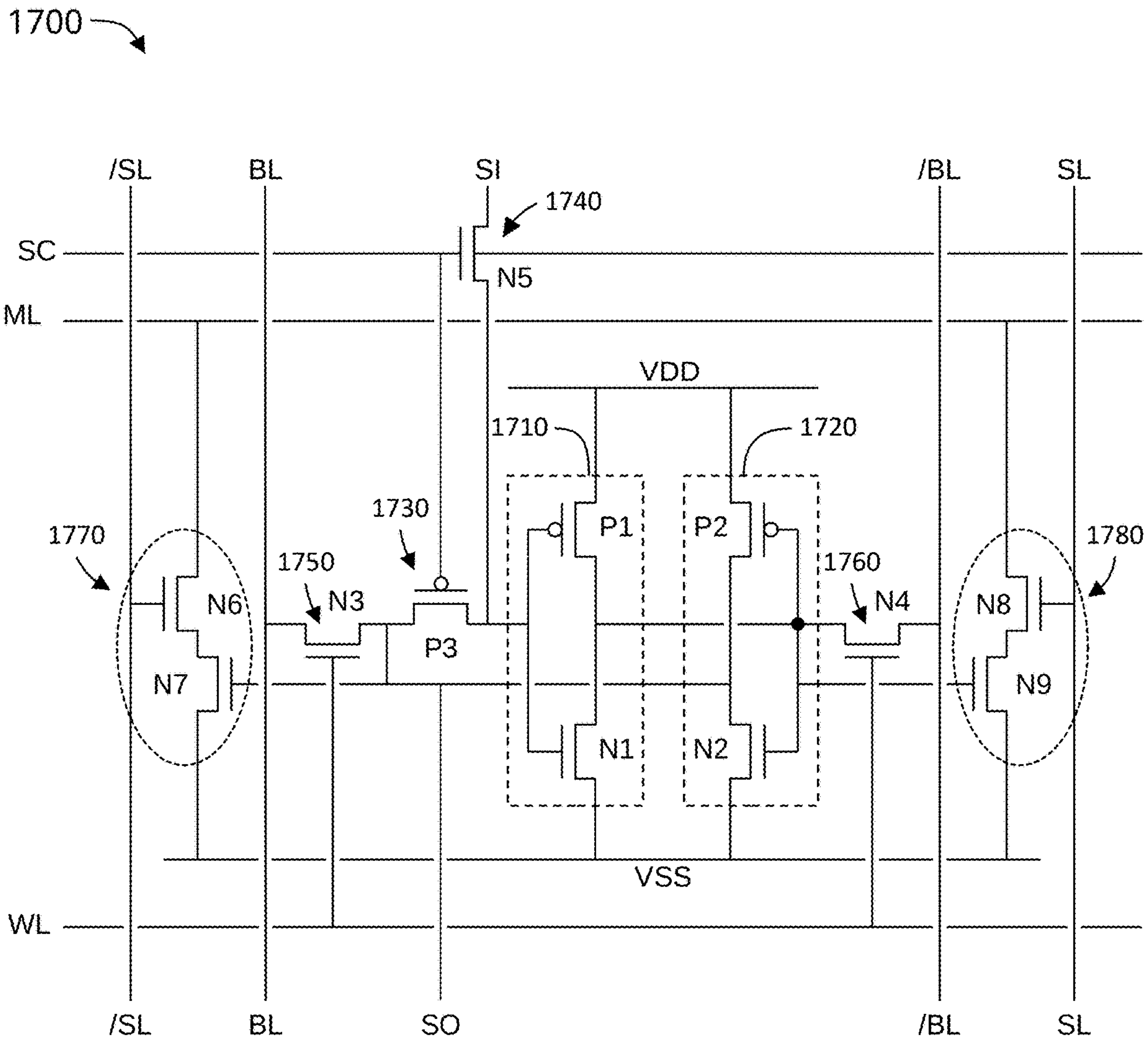
FIG. 17 - Scannable binary CAM cell

SCANNABLE SRAM

RELATED APPLICATIONS

This application claims priority to U.S. patent application Ser. No. 63/719,082, entitled "Scannable SRAM", filed on Nov. 11, 2024, which is incorporated herein by reference.

REFERENCES

This application is related to U.S. patent application Ser. No. 18/207,482, entitled "Fully Scannable Memory Arrays", filed on Jun. 8, 2023, and to U.S. patent application Ser. No. 18/752,634, entitled "A Scannable Memory Array and A Method for Scanning Memory", filed on Jun. 24, 2024, both by the same inventors and applicant, and both co-owned by the same assignee. The related applications are hereby incorporated by reference as if set forth in full in this specification.

Each publication, patent, and/or patent application mentioned in this specification is herein incorporated by reference in its entirety to the same extent as if each individual publication and/or patent application was specifically and individually indicated to be incorporated by reference.

BACKGROUND

Technical Field

The disclosed implementations relate generally to electrical computers and digital data processing systems: input/output, and more specifically to systems and methods used in testing of integrated circuits (ICs), and design-for-test (DFT) of memory ICs.

Context

Memories on integrated circuits have until now been tested in a variety of ways, including functional tests, built-in self-test (BIST) specially adapted for memory (M-BIST or MBIST), and random or pseudo-random tests. One popular way of testing logic (scan test) is seldom or never used because of the high cost of the flip-flop required in a conventional scan chain architecture. However, a scannable memory can offer large benefits both for debugging prototypes and for production testing.

BRIEF DESCRIPTION OF THE DRAWINGS

The technology will be described with reference to the drawings, in which:

FIG. 1 shows a basic form of a static random-access memory cell (SRAM cell).

FIG. 2 illustrates a typical conventional SRAM cell that uses complementary bit lines.

FIG. 3 shows a typical implementation of the conventional SRAM of FIG. 2 in transistors.

FIG. 4 illustrates an example of a scannable SRAM cell, built on the SRAM cell in FIG. 1.

FIG. 5 illustrates an example scannable SRAM cell based on the common SRAM cell of FIG. 2.

FIG. 6 illustrates an example of scan mode timing for the scannable SRAM cell of FIG. 5.

FIG. 7 shows an example transistor-level implementation of a scannable SRAM cell with the architecture in FIG. 5.

FIG. 8 illustrates an example scannable SRAM cell with an inverted scan control input (/SC).

FIG. 9 illustrates an example scannable SRAM cell with both SC and /SC inputs, which allows the first scan loop switch and the first scan access switch to be of the same type.

FIG. 10 illustrates an example of a fully complementary scannable SRAM cell.

FIG. 11 illustrates an example transistor-level implementation of the SRAM cell in FIG. 10.

FIG. 12 illustrates another example of a fully complementary scannable SRAM cell.

FIG. 13 illustrates an example transistor-level implementation of the SRAM cell in FIG. 12.

FIG. 14 illustrates an example implementation of a scannable SRAM cell with an amplified scan output signal.

FIG. 15 illustrates an example transistor-level implementation SRAM cell of the topology in FIG. 14.

FIG. 16 illustrates an example implementation of a scannable dual-port SRAM cell.

FIG. 17 illustrates an example scannable content-addressable memory cell (CAM cell).

Figure 18:
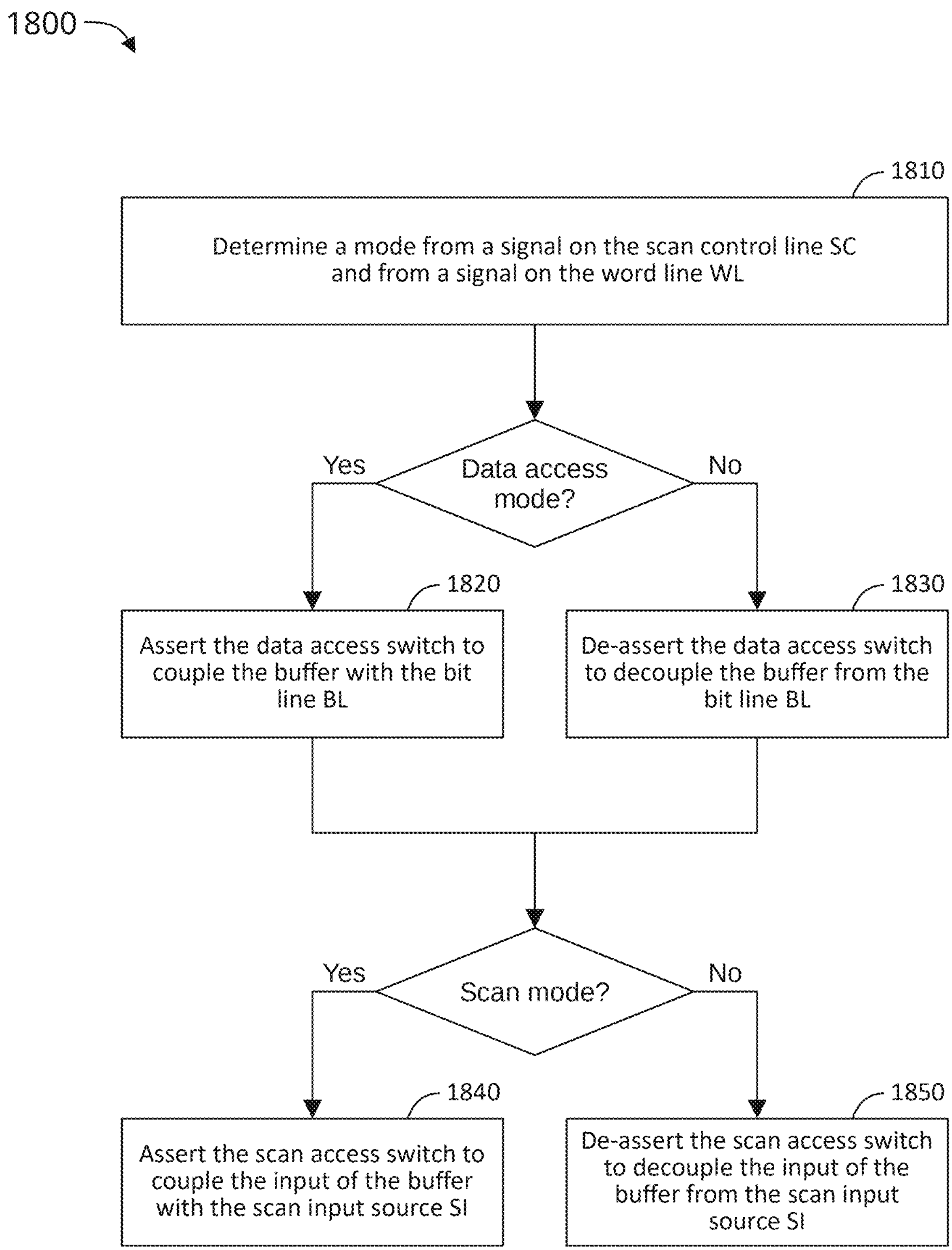
FIG. 18 illustrates an example method of using a scannable SRAM cell.

In the figures, like reference numbers may indicate functionally similar elements. The systems and methods illustrated in the figures—and described in the Detailed Description below—may be arranged and designed in a wide variety of different implementations. Neither the figures nor the Detailed Description are intended to limit the scope as claimed. Instead, they merely represent examples of different implementations.

DETAILED DESCRIPTION

A popular method of testing large digital integrated circuits (ICs), especially systems-on-a-chip (SoCs) or processor ICs, is the use of scan chains. Scan chains are formed of memory elements that are usually already embedded in the design. Scan chains are not enabled during normal operation, as the memory elements may be coupled with each other via digital gates and other circuits that function for normal operation. When a scan is performed, the memory elements are temporarily directly linked with each other, forming one or more scan chains that can be used for presetting or reading out their content. Presetting their content allows controlling the memory content to provide known input data for the gates and circuits that are needed for normal operation. Reading out their content allows observing the state of the gates and circuits after performing their normal operation. The ability to control and observe allows a chip designer to verify correctness of the chip's operation when prototypes are received from a fab. It also allows for low-cost testing of chips during volume production.

Conventional scan chains are built using scannable flip-flops, memory elements that require at least 20 transistors to build. However, an array of memory cells can be very large, and must be built using latches to save chip area and thus reduce cost. A D-latch based memory cell normally takes only 8 or 10 transistors, and a static random-access memory (SRAM) cell normally takes only 6 transistors. Until now, no architecture was known that would affordably support scan in an array of latches. As a result, large memories are excluded from scan testing, and they actually interfere with scan testing by being separated from surrounding logic. As a result, automated production test of memories requires much more expensive tests, including built-in self-test for memory (MBIST or M-BIST) and functional test.

A prior patent application by the same inventors and applicant, entitled "A Scannable Memory Array and A Method for Scanning Memory", describes various architectures for scannable memory arrays and discloses that in general a scannable memory cell may include an input multiplexer to select between a data input (DI) signal and a scan input (SI) signal based on a scan enable (SE) signal, and a latch to store the data. A flush (FSH) input controls whether the latch is in a transparent mode or storing data. Whereas a conventional scan architecture would suffer from flush-through of the data if memory cells would use latches instead of flipflops, the document discloses architectures that prevent flush-through by not clocking adjacent latches in the scan chain simultaneously. The document further discloses an example scannable SRAM cell. One difference between most of the scannable latches described there and a scannable SRAM cell is that the scannable SRAM cell combines the FSH and SE inputs into a single scan control SC input to use fewer transistors in the cell. However, when an IC includes both conventional scan chains and scan chains with scannable SRAM cells, the architecture must be adapted to generate the SC signals at the appropriate times.

This document discloses static memory cells that can be used in various scannable SRAMs, with the potential to forever change design and test of large digital ICs.

Terminology

As used herein, the phrase "one of" should be interpreted to mean exactly one of the listed items. For example, the phrase one of A, B, and C should be interpreted to mean any of: only A, only B, or only C.

As used herein, the phrases "at least one of" and "one or more of" should be interpreted to mean one or more items. For example, the phrase "at least one of A, B, or C" or the phrase "one or more of A, B, or C" should be interpreted to mean any combination of A, B, and/or C. The phrase "at least one of A, B, and C" means at least one of A and at least one of B and at least one of C.

Unless otherwise specified, the use of ordinal adjectives "first", "second", "third", etc., to describe an object merely refers to different instances or classes of the object and does not imply any ranking or sequence.

The terms "comprising" and "consisting" have different meanings in this patent document. An apparatus, method, or product "comprising" (or "including") certain features means that it includes those features but does not exclude the presence of other features. On the other hand, if the apparatus, method, or product "consists of" certain features, the presence of any additional features is excluded.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases, the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetic, or mechanical, between the things that are connected, without any intervening things or devices.

The term "configured to" perform a task or tasks is a broad recitation of structure generally meaning having circuitry that performs the task or tasks during operation. As such, the described item can be configured to perform the task even when the unit/circuit/component is not currently on or active. In general, the circuitry that forms the structure corresponding to "configured to" may include hardware circuits, and may further be controlled by switches, fuses, bond wires, metal masks, firmware, and/or software. Similarly, various items may be described as performing a task or tasks, for convenience in the description. Such descriptions should be interpreted as including the phrase "configured to".

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B". This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase "based on" is thus synonymous with the phrase "based at least in part on".

The terms "substantially", "close", "approximately", "near", and "about" refer to being within minus or plus 10% of an indicated value, unless explicitly specified otherwise.

The following terms or acronyms used herein are defined at least in part as follows:

"ASIC"—application-specific integrated circuit

"BIST"—built-in self-test—the capability of an integrated circuit to test (a part of) itself, to reduce the time that external test equipment may need to be used to validate the chip's correct functionality. In some cases, BIST can be directed to a specific type of circuit. For example, memory BIST ("MBIST") is dedicated to testing memory arrays.

"CMOS"—complementary metal-oxide-semiconductor

"DFT"—design-for-test

"DI"—data input

"FPGA"—field-programmable gate array

"FSH" or "/FSH"—"flush" input—the control input of a latch that determines whether the latch holds its stored value (storage mode) or is transparent (flush mode).

"IC"—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.

"MCM"—multi-chip module

"NMOS"—N-type metal-oxide-semiconductor

"PMOS"—P-type metal-oxide-semiconductor

"Scan control" ("SC")—a signal used in scannable SRAM cells to enable scan chain functionality in the cell and to place the embedded latch in flush mode. The SC control signal combines the functions of the FSH and SE signals that may be used in other scannable memory cells.

"Scan enable" ("SE")—a signal used to place an IC, or part of an IC, in scan mode, as opposed to other modes such as operational mode, or various standby and sleep modes. The SE signal is applied to all memory elements in a scan chain, which then ignore data inputs in favor of scan inputs connected to prior memory element outputs in the chain.

"SI"—scan input

"SO"—scan output

"SRAM"—static random-access memory

Implementations

The figures described in this section include various controlled switches. Each controlled switch includes two data terminals and one control terminal. A voltage on the control terminal determines whether the controlled switch conducts or not. The drawings depict controlled switches in the state in which their control input is not asserted. Thus, a normally-on switch is shown as closed, and a normally-off switch is shown open.

FIG. 1 shows a basic form of a static random-access memory cell (SRAM cell 100). SRAM cell 100 includes a non-inverting amplifier 109 and a controlled switch 150. Amplifier 109 is non-linear, in the sense that its output signal is limited to a range of values. For instance, many amplifiers can deliver an output signal that cannot go below 0 Volts, and that cannot go above the value of a supply voltage VDD. If the input signal of the amplifier is large enough, its output will clip at or near VDD, and if the signal is low enough, its output will clip near or at 0V (GND or VSS). Amplifier 109 is configured in a positive feedback loop, i.e., when the input receives a high or positive signal, its output delivers an even higher or more positive signal, which is fed back to the input, thus reinforcing the input signal. When the output signal is at the high end of its range, the input signal stays at the high end too, thus keeping the circuit stable at the high end of the signal range. Conversely, when the input receives a low or negative signal, the output of amplifier 109 delivers an even lower or more negative signal, which being fed back reinforces the input signal towards the low end of the signal range. Thus, the amplifier has two stable states.

A signal at the word line WL may assert controlled switch 150 which then connects amplifier 109 with the bit line BL. A sense amplifier (not drawn) or other circuit that monitors the bit line BL can read the state of SRAM cell 100. Alternatively, a driver circuit (not drawn) may force the bit line BL in a state that is different than the current state of SRAM cell 100, and force it to change value. The arrangement requires that the driver circuit can overpower amplifier 109, and deliver a stronger signal than amplifier 109.

Memory cells are typically arranged in an array that includes rows of memory cells each coupled with the same word line, and columns of memory cells each coupled with the same bit line(s). Thus, a single driver and a single sense amplifier can service one column of memory cells, and when a single word line is asserted, the memory cells of that row connect with their respective bit lines to be written by their respective driver circuits or to be read by their respective sense amplifiers.

In current semiconductor technologies, controllable switches can be implemented with a single transistor. The most pervasive transistor technology, complementary metal-oxide-semiconductor (CMOS) technology, provides p-channel metal-oxide-semiconductor (PMOS) and n-channel metal-oxide-semiconductor (NMOS) transistors, based on the doping material used to provide the semiconductor material with negative signal carriers (electrons) or positive signal carriers (missing electrons, or holes). A switch made with a PMOS transistor is asserted (i.e., conducting) when a voltage on its gate is low, and a switch made with an NMOS transistor is asserted (conducting) when a voltage on its gate is high. The combination of switches with this opposing behavior makes it possible to create circuits that consume very low power when they're in a steady state.

CMOS SRAM cells benefit from this possibility to achieve a very low power consumption. However, the non-inverting amplifier takes at least four transistors and is typically accomplished by chaining two inverters. The inverters have a gain larger than 1.0 (otherwise the steady state cannot be maintained in the positive feedback loop), but their drive strength is small to keep the memory cells small (less expensive) and to make it possible to overpower them even when driver circuits are located far away at the edge of an array. The memory cell's small drive strength means that reading its state by the sense amplifier is also more difficult. To alleviate this problem, memories typically use two bit lines per column, with complementary polarities (a bit line BL, and an inverted bit line /BL). It is easier to read a small differential signal than a small unipolar signal.

FIG. 2 illustrates a typical conventional SRAM cell 200, for use with complementary bit lines. Like SRAM cell 100, it has an amplifier. The amplifier is non-inverting in a feedback loop configuration, but it includes (FIG. 2) a first inverting gate 210 and a second inverting gate 220. A positive input/output pair of the amplifier is coupled with bit line BL via first data access switch 250. A negative input/output pair of the amplifier coupled with the inverted bit line /BL via second data access switch 260. Both first data access switch 250 and second data access switch 260 are controlled byword line WL, which can assert the two controlled switches at the same time to couple the complementary inputs/outputs of the amplifier with the complementary bit lines.

FIG. 3 shows a typical implementation of the conventional SRAM of FIG. 2 in transistors. This implementation is known as a 6T cell because it uses six transistors. SRAM 300 includes the first inverting gate 210 implemented as first inverting gate 310 with a PMOS transistor P1 and an NMOS transistor N1, whose input is coupled with first data access switch 350 (NMOS transistor N3) and also with the output of second inverting gate 320. Second inverting gate 220 is implemented as second inverting gate 320 with PMOS transistor P2 and NMOS transistor N2, whose input is coupled with second data access switch 360 (NMOS transistor N4) and also with the output of first inverting gate 310. First inverting gate 310 and second inverting gate 320 are powered from the voltage between two power supply lines (VDD and VSS), which may be routed along a row of memory cells.

It is possible to build SRAM cells with fewer transistors. For example, some semiconductor manufacturing processes offer either only NMOS transistors or only PMOS transistors. In those cases, the function of the remaining two transistors is performed by resistors. Thus, an SRAM cell would have two NMOS transistors and two resistors, or two PMOS transistors and two resistors. These cells are known as 4T2R cells because they include four transistors and two resistors. One disadvantage is that resistors take relatively much die area to implement (hence, they are expensive), and another disadvantage is that there is always a current flowing in one of the two inverters, which means that the power dissipation of such cells is relatively high.

It is also possible to build SRAM cells using six transistors that are not complementary. For example in an NMOS process, instead of using resistors or PMOS transistors, a memory cell can use depletion-mode NMOS transistors that are configured as resistors. Not many semiconductor processes offer depletion-mode transistors, and although depletion-mode transistors can be much smaller than resistors, the power usage disadvantage remains. Thus, these cells may be uncommon, but they can still form the basis for the scannable SRAM cells described in this patent document.

Another variation can be in the controlled switches. Although most implementations use NMOS transistors (N3 and N4) coupled with a positive word line WL, an implementation could use PMOS transistors instead, coupled with an inverted word line /WL. In silicon, the speed of holes (positive carriers) is lower than the speed of electrons (negative carriers), so PMOS devices are slower than NMOS devices. But a different semiconductor material may offer a hole speed that is larger than or equal to the speed of electrons, and PMOS devices may be faster than or equally fast as NMOS devices. Again, the technology disclosed in this patent document can be used in those types of SRAM cell implementations.

One problem of chaining latches in a scan chain using pass transistors to form the chain is that the latches typically have equal drive strength (for example, because an array of memory cells uses identical memory cells). Forcing a latch to switch state by another latch that has equal strength may not lead to predictable results. The implementations in FIGS. 4-13 and FIGS. 18-16 solve this problem by temporarily breaking the feedback loop, thus creating an amplifying chain with an input and an output. The implementations in FIGS. 17-15 solve this problem by providing extra drive strength to the memory cell's scan output.

FIG. 4 illustrates a basic example of a scannable SRAM cell, built on the basic SRAM cell described with reference to FIG. 1. Scannable SRAM cell 400 interfaces with a bit line BL via a bit line BL terminal, with a word line WL via a word line WL terminal, and with a scan control line SC via a scan control line SC terminal. It further has a scan input SI terminal and a scan output SO terminal. Terminals may not be drawn explicitly in this document, but their existence is implied by any connections to the respective lines (BL, WL, SC, and others drawn in the figures). While scan flip-flops usually have both a clock input and a scan enable input and previously published scannable latches have a flush input and a scan enable input, scannable SRAM cells in this document have a scan control input, which combines the functions of enabling scan in the memory cell and clocking it.

The scan control line SC may be stitched along a row (as drawn), or along a column, or in any other way. SRAM cell 400 includes a non-inverting amplifier 409 (similar to amplifier 109 of FIG. 1), as well as a first data access switch 450 (similar to controlled switch 150 of FIG. 1 and first data access switch 250 of FIG. 2), and adds a first scan loop switch 430 and a first scan access switch 440. The controlled switches and non-inverting amplifier may be implemented using any transistor technologies known in the art.

First data access switch 450 is controlled by word line WL. When WL is asserted, first data access switch 450 is asserted (and conducts as a result). First scan loop switch 430 and first scan access switch 440 are controlled by the scan control line SC. But, while first scan access switch 440 conducts when SC is asserted, first scan loop switch 430 conducts when SC is de-asserted. In other words, when first scan access switch 440 is open, first scan loop switch 430 is closed, and vice versa.

Amplifier 409 has an input coupled with a data terminal of first scan access switch 440 and a data terminal of first scan loop switch 430. It has an output coupled with the other data terminal of first scan loop switch 430, with a data terminal of first data access switch 450 and with the scan output SO. The other data terminal of first data access switch 450 is coupled with the bit line BL. The other data terminal of first scan access switch 440 is coupled with scan input SI. The control terminals of first scan loop switch 430 and first scan access switch 440 are coupled with the scan control line SC. The control terminal of first data access switch 450 is coupled with the word line WL.

The word line WL is used in normal operational mode of an array of memory cells (SRAM cells) to address a row of the memory cells and couple them with their respective bit lines. A bit line may carry write information from a driver circuit that overpowers the output of amplifier 409 and can force the memory cell to change state. Alternatively, the bit line may be monitored by a sense amplifier that reads the states of the memory cell.

The scan control line SC is used in scan mode of the array of memory cells. The scan chain may be stitched along rows of memory cells, along columns of memory cells, or in any other way. When the scan control line SC is asserted, first scan access switch 440 couples the scan input SI with the input of amplifier 409, whereas first scan loop switch 430 decouples the input of amplifier 409 from its output, from the scan output SO, and from first data access switch 450. In this way, the positive feedback loop is interrupted, and the output of amplifier 409 does not reinforce the state of its input. As a result, the output of amplifier 409 does not need to be overpowered, and the sensitive input of amplifier 409 can easily be moved by a weak output signal of the prior scannable SRAM cell in the scan chain. When subsequently the scan control line SC is de-asserted, the first scan access switch 440 decouples scan input SI from amplifier 409, and first scan loop switch 430 once more couples the output of amplifier 409 with its input. Since amplifier 409 is noninverting, its output signal follows the input signal when SC is asserted, and it reinforces the state the memory cell is in at the moment SCE is de-asserted. Parasitic capacitances at the input of amplifier 409 hold the signal long enough for the transition to take place. In some implementations, the memory cell may perform a make-before-break sequence, and in other implementations, the memory cell may perform a break-before-make sequence. The order of making and breaking can be determined by the choice of switches. For example, in silicon a PMOS transistor is generally slower than an NMOS transistor.

FIG. 5 illustrates an example scannable SRAM cell based on the common SRAM cell of FIG. 35. SRAM cell 500 splits amplifier 409 in a first inverting gate 510 and a second inverting gate 520. An inverting gate may be an inverter, as drawn, a NAND gate, a NOR gate, or any other combinational logic that generates an output signal that is inverted from an input signal. SRAM cell 500 adds a second data access switch 560 (similar to second data access switch 260 of FIG. 2) and an inverted bit line /BL. The first scan loop switch 530, first scan access switch 540, and first data access switch 550 have the same functionality as first scan loop switch 430, first scan access switch 440, and first data access switch 450.

First inverting gate 510 has an input coupled with a data terminal of first scan access switch 540 and a data terminal of first scan loop switch 530. It has an output coupled with a data terminal of second data access switch 560 and an input of second inverting gate 520. Second inverting gate 520 has an output coupled with the other data terminal of first scan loop switch 530, with a data terminal of first data access switch 550 and with the scan output SO. The other data terminal of first data access switch 550 is coupled with the bit line BL, and the other data terminal of second data access switch 560 is coupled with the inverted bit line /BL. The other data terminal of first scan access switch 540 is coupled with scan input SI. The control terminals of first scan loop switch 530 and first scan access switch 540 are coupled with the scan control line SC. The control terminal of first data access switch 550 and the control terminal of second data access switch 560 are coupled with the word line WL.

The word line WL is used in normal operational mode of an array of memory cells (SRAM cells) to address a row of the memory cells and couple them with their respective bit lines. The bit lines may carry write information from a driver circuit that overpowers the output of amplifier 409 and can force the memory cell to change state. Alternatively, the bit lines may be monitored by a sense amplifier that reads out the state of the memory cell.

While in normal operational mode, SRAM cell 500 accesses both bit lines BL and /BL when the word line WL is asserted. In scan mode, SRAM cell 500 functions the same as SRAM cell 400, where the first inverting gate 510 and the second inverting gate 520 together provide the amplification of amplifier 409.

FIG. 6 illustrates an example of scan mode timing 600 for the scannable SRAM cell of FIG. 5. In this example, the word line WL is kept de-asserted, so the state of the bit line BL and /BL is ignored, and not impacted by SRAM cell 500. Initially, the scan input SI is low and while scan control SC is de-asserted, the scan output SO depends on a prior cycle, which may be unknown. When the scan control SC is asserted, the latch state becomes determined by the state of SI, and its output SO assume the value of SI, and becomes low. It stays low even when scan control SC is de-asserted. After some time, the scan input SI may change value and become high. When the scan control SC is asserted again, SO assumes the new value of SI, in this case high. Thus, while the bit lines BL and /BL are decoupled from the latch in FIG. 5, the scan control signal SC allows the latch to be set by the value on the scan input SI. The scan output SO of the latch always forwards its value to the scan input of a next scannable SRAM cell in the scan chain.

FIG. 7 shows a transistor-level implementation (scannable SRAM cell 700) of the architecture in FIG. 5. SRAM cell 700 includes elements of an implementation such as shown in FIG. 4 (first inverting gate 710 (P1, N1), second inverting gate 720 (P2, N2), first data access switch 750 (N3), and second data access switch 760 (N4)) and adds first scan loop switch 730 (P3) and first scan access switch 740 (N5). By using complementary devices (PMOS vs NMOS) for first scan loop switch 830 and first scan access switch 840, it is possible to assert and de-assert them simultaneously from the same scan control line SC.

The first scan loop switch 730 (P3) has a first control terminal (as drawn, its gate) coupled with the scan control line (SC). The first scan access switch 840 (N5) has a second control terminal (as drawn, its gate) coupled with the scan control line. In some implementations (e.g., as in FIG. 7), a single scan control line interfaces with the memory cell. In other implementations (e.g., as in FIG. 9), two separate scan control lines interface with the memory cell, for example to control the first scan loop switch and the first scan access switch separately.

First inverting gate 710 (including N1 and P1) has an input coupled with a data terminal (source or drain) of first scan access switch 740 (N5) and a data terminal (source or drain) of first scan loop switch 930 (P3). It has an output coupled with a data terminal (source or drain) of second data access switch 760 (N4) and an input of second inverting gate 720 (which includes N2 and P2). Second inverting gate 720 has an output coupled with the other data terminal (drain or source) of first scan loop switch 730 (P3), with a data terminal (source or drain) of first data access switch 750 (N3) and with the scan output SO. The other data terminal (drain or source) of first data access switch 750 (N3) is coupled with the bit line BL, and the other data terminal (drain or source) of second data access switch 760 (N4) is coupled with the negative bit line /BL. The other data terminal (drain or source) of first scan access switch 940 (N5) is coupled with scan input SI. The control terminals (gates) of first scan loop switch 730 (P3) and first scan access switch 740 (N5) are coupled with the scan control line SC. The control terminal (gate) of first data access switch 750 (N3) and the control terminal (gate) of second data access switch 760 (N4) are coupled with the word line WL.

First scan loop switch 730 (P3) is configured to be off in scan mode (when SC is asserted), thus breaking a positive feedback loop between first inverting gate 710 and second inverting gate 720. First scan access switch 740 (N5) is configured to be on in scan mode, thus passing on scan input data from SI to the input of first inverting gate 710. First inverting gate 710 amplifies and inverts the scan input data and passes it on to the input of second inverting gate 720, which inverts it again and passes it on to the scan output (SO).

When the scan control input SC is asserted, first scan loop switch 730 is off, which breaks the positive feedback loop that involves first inverting gate 710 and second inverting gate 720. First scan access switch 740 is on, which allows a signal from the scan input SI to pass to the input of first inverting gate 710 and propagate to the output of second inverting gate 720. Once the scan control input SC is de-asserted, first scan access switch 740 switches off. The parasitic capacitance at the input of first inverting gate 710 maintains its charge and when first scan loop switch 730 switches on (because SC is de-asserted), the positive feedback loop is closed again, and the output signal of second inverting gate 720 ensures that the input value of first inverting gate 710 remains the same.

FIG. 8 illustrates an example scannable SRAM cell 800 with inverted scan control input (/SC). The topology of SRAM cell 800 can be the same as the topology of SRAM cell 700. However, because the scan control input is inverted, first scan loop switch 830 (N5) in SRAM cell 800 may be an N-type transistor, whereas first scan loop switch 730 (P3) in SRAM cell 800 may be a P-type transistor. The first scan access switch 840 (P3) in SRAM cell 800 may be a P-type transistor while first scan access switch 740 in SRAM cell 700 may be an N-type transistor.

FIG. 9 illustrates an example scannable SRAM cell 900 with both SC and /SC inputs, which allows first scan loop switch 930 (N5) and first scan access switch 940 (N6) to be of the same type. In this case, both are N-type transistors. Since one of them must be asserted while the other one is de-asserted, they must be driven from complementary scan control lines SC and /SC. This is also the case in an implementation that uses P-type transistors for both. However, in the case of P-type transistors, the first scan loop switch would be controlled by SC and the first scan access switch would be controlled by /SC.

FIG. 10 illustrates an example of a fully complementary scannable SRAM cell 1000. The scan input SI is coupled with the input of first inverting gate 1010 via first scan access switch 1040, whereas the inverted scan input /SI is coupled with the input of second inverting gate 1020 via second scan access switch 1080. The input of first inverting gate 1010 can be decoupled from the output of second inverting gate 1020 by first scan loop switch 1030 whereas the input of second inverting gate 1020 can be decoupled from the output of first inverting gate 1010 by second scan loop switch 1070. The scan output SO and the inverted scan output /SO are coupled with the outputs of second inverting gate 1020 and first inverting gate 1010, respectively. The input switches first scan access switch 1040 and first data access switch 1050 can be interpreted as creating a first scan input multiplexer, controlled by the word line WL and the scan control input SC, whereas the input switches second scan access switch 1080 and second data access switch 1060 can be interpreted as creating a second (complementary) scan input multiplexer, also controlled by the word line WL and the scan control line SC.

FIG. 11 illustrates a transistor-level implementation SRAM cell 1100 of SRAM cell 1000 in FIG. 10. The first scan loop switch 1130 and second scan loop switch 1170 are implemented by P-type MOSFETs P3A and P3B. Both are controlled by the scan control line SC. The first scan access switch 1140 and second scan access switch 1180 are implemented by N-type MOSFETs N4A and N4B, respectively. Both are also controlled by the scan control line SC.

FIG. 12 illustrates another example of a fully complementary scannable SRAM cell 1200. SRAM cell 1200 is very similar to SRAM cell 1000, however, compared to first data access switch 1050 and second data access switch 1060, first data access switch 1250 and second data access switch 1260 are on the other side of the scan loop switches. This has little impact on the operation of the cell, because in normal operation, first scan loop switch 1230 and second scan loop switch 1270 are closed, so effectively the bit lines BL and /BL connect to the latch in the same place, and in scan operation, first data access switch 1250 and second data access switch 1260 are open, so the bit lines are not connected to the latch at all.

FIG. 13 illustrates an example transistor-level implementation SRAM cell 1300 of SRAM cell 1200 in FIG. 12. The first scan loop switch 1330 and second scan loop switch 1370 are implemented by P-type MOSFETS P3A and P3B. Both are controlled by the scan control line SC. The first scan access switch 1340 and second scan access switch 1380 are implemented by N-type MOSFETs N4A and N4B, respectively. Both are also controlled by the scan control line SC.

Unlike the implementations of FIGS. 4-13, which all depend on breaking the memory cell's loop to allow it to be set or reset by an equally weak other memory cell, FIGS. 14-15 rely on amplifying a memory cell's scan output signal. Amplification is done before the scan access switch to prevent the memory cell entering an unpredictable state.

FIG. 14 illustrates an example implementation of a scannable SRAM cell with an amplified scan output signal. FIG. 14 shows SRAM cell 1400 which interfaces with complementary bit lines BL and /BL, a word line WL, a scan control line SC, a scan input SI, and a scan output SO. The basic SRAM cell as in FIG. 2 is formed by first inverter 1410, second inverter 1420, first data access switch 1450, and second data access switch 1460. Their topology with respect to the bit lines and the word line is the same as in FIG. 2, and their functionality is the same. FIG. 14 adds a first scan access switch 1440, and a third inverter 1422. The first scan access switch 1440 couples the input of first inverter 1410 with the scan input SI when the scan control line SC is asserted. The third inverter 1422 has an input coupled with the output of first inverter 1410, and an output coupled with the scan output SO. While first inverter 1410 and second inverter 1420 may have substantially equal drive strengths, third inverter 1422 has a substantially larger drive strength, for example double the drive strength. The higher drive strength of third inverter 1422 makes it possible to overpower the latch in a subsequent SRAM cell in a scan chain.

FIG. 15 illustrates an example transistor-level implementation SRAM cell 1500 of the topology in SRAM cell 1400. Each of first inverter 1510, second inverter 1520, and third inverter 1522 includes a regular CMOS inverter (implementations in other technologies may use other inverters than CMOS inverters), but third inverter 1522 has a larger drive strength than first inverter 1510 and second inverter 1520. This is achieved by scaling its transistors. For example, P3 and N3 may be twice as large as P1, P2, N1, and N2.

The first scan access switch 1440, first data access switch 1450, and second data access switch 1460 are implemented using pass transistors, in this case first scan access switch 1540 (N6), first data access switch 1550 (N4), and second data access switch 1560 (N5). Although in this example they are all N-type transistors (because of the polarity of SC and WL), in another implementation they may all be P-type transistors, or a mix of N-type and P-type transistors.

FIG. 16 illustrates an example implementation of a scannable dual-port SRAM cell 1600. Multiport SRAM cells are based on a standard SRAM cell, adding bit lines and word lines to provide double access. Similarly, a scannable multiport SRAM cell adds bit lines and word lines to provide multiple access. This example, compared to SRAM cell 700 of FIG. 7, adds one word line and a set of complementary bit lines, so that dual-port SRAM cell 1600 interfaces with word lines WL1 and WL2, bit lines BL1, /BL1, BL2, and /BL2, scan control line SC, scan input SI, and scan output SO. As in FIG. 7, word line WL1 provides data access via bit line BL1 using first data access switch 1650 and via bit line /BL1 using second data access switch 1660. Here, word line WL2 provides additional data access via bit line BL2 using third data access switch 1670 and via bit line /BL2 using fourth data access switch 1680.

The first scan loop switch 1630 (P3) has a first control terminal (as drawn, its gate) coupled with the scan control line (SC). The first scan access switch 1640 (N7) has a second control terminal (as drawn, its gate) coupled with the scan control line.

The first inverting gate 1610 (including N1 and P1) has an input coupled with a data terminal (source or drain) of first scan access switch 1640 (N7) and a data terminal (source or drain) of first scan loop switch 1630 (P3). It has an output coupled with a data terminal (source or drain) of second data access switch 1660 (N4), with a data terminal (source or drain) of fourth data access switch 1680 (N6), and with an input of second inverting gate 1620 (which includes N2 and P2). Second inverting gate 1620 has an output coupled with the other data terminal (drain or source) of first scan loop switch 1630 (P3), with a data terminal (source or drain) of first data access switch 1650 (N3), with a data terminal (source or drain) of third data access switch 1670, and with the scan output SO. The other data terminal (drain or source)

of first data access switch first data access switch 1650 (N3) is coupled with bit line BL1; the other data terminal (drain or source) of second data access switch 1660 (N4) is coupled with the negative bit line /BL1. The other data terminal (drain or source) of first data access switch third data access switch 1670 (N5) is coupled with bit line BL2; the other data terminal (drain or source) of fourth data access switch 1680 (N6) is coupled with the negative bit line /BL2. The other data terminal (drain or source) of first scan access switch 1640 (N7) is coupled with scan input SI. The control terminals (gates) of first scan loop switch 1630 (P3) and first scan access switch 1640 (N7) are coupled with the scan control line SC. The control terminal (gate) of first data access switch 1650 (N3) and the control terminal (gate) of second data access switch 1660 (N4) are coupled with the first word line WL1. The control terminal (gate) of third data access switch 1670 (N5) and the control terminal (gate) of fourth data access switch 1680 (N6) are coupled with the second word line WL2.

FIG. 17 illustrates an example scannable content-addressable memory cell (CAM cell 1700). Unlike RAM arrays, which return data when presented with an address, a CAM array returns an address when presented with data. A binary CAM cell stores one bit of information (for example, the value "0" or "1"). A ternary CAM cell can store three values (for example, "0", "1", and "don't care"). A binary CAM cell usually includes an SRAM cell with a few extra transistors to compare the stored data value with the searched data value. A ternary CAM cell usually includes two SRAM cells with a few extra transistors to compare the stored data value with the searched data value. CAM cells are well documented in the art, and an overview is available, for example, at https://en.wikipedia.org/wiki/Content-addressable_memory.

CAM cell 1700 is a binary CAM cell, and it includes a scannable SRAM cell, in this example identical to SRAM cell 700 presented earlier in FIG. 7. This comprises first inverter 1710, second inverter 1720, first scan loop switch 1730 (P3), first scan access switch 1740 (N5), first data access switch 1750 (N3), and second data access switch 1760 (N4), which together interface with the word line WL, the complementary bit lines BL and /BL, the scan control line SC, the scan input SI, and the scan output SO. The binary search function adds four transistors to compare the complementary stored signal with signals on complementary search lines SL and /SL. Transistors N6 and N7 (left-hand side 1770) and transistors N8 and N9 (right-hand side 1780) together form an AND function. If the stored signal mismatches the signal on the search lines, then either left-hand side 1770 or right-hand side 1780 will pull down match line ML. Other well-known CAM topologies perform a NOR function for the comparison. In CAM cell 1700, the implementation replaces the traditionally included SRAM cell with a scannable SRAM cell. Both scannable CAM cells with an AND function and a NOR function are within the scope and ambit of this disclosure. Similarly, an implementation may replace the traditionally included two SRAM cells in a ternary CAM cell with scannable SRAM cells to provide a scannable ternary CAM cell.

FIG. 18 illustrates an example method 1800 of using a scannable SRAM cell. The SRAM cell interfaces with a word line WL, a scan control line SC, a bit line BL, a scan input source SI, and a scan output destination SO. The scannable SRAM cell includes a buffer, a data access switch controlled by the world line WL, and a scan access switch controlled by the scan control line SC and configured to couple an input of the buffer with the scan input source SI. Method 1800 comprises:

1810—determining a mode from a signal on the scan control line SC and a signal on the word line WL. For example, if the signal on the word line WL is asserted, the mode may be a data access mode. And if the signal on the scan control line SC is asserted, the mode may be a scan mode.

1820—upon determining that the mode is a data access mode, asserting the data access switch to couple the buffer with the bit line BL. An implementation can then write data into the SRAM cell or read data from the SRAM cell.

1830—upon determining that the mode is not a data access mode, deasserting the data access switch to decouple the buffer from the bit line BL.

1840—upon determining that the mode is a scan mode, asserting the scan access switch to couple the input of the buffer with the scan input source SI. Some implementations interrupt a positive feedback loop (at the buffer) to decouple the buffer output from the buffer input. The implementation can then write scan information from the scan input source SI in the buffer.

1850—upon determining that the mode is not a scan mode, deasserting the scan access switch to decouple the input of the buffer from the scan input source SI. Some implementations restore a positive feedback loop at the buffer to couple the buffer output with the buffer input.

Particular Implementations

Described implementations of the subject matter can include one or more features, alone or in combination, as described in the following clauses.

Clause 1. A scannable memory cell, with a bit line BL terminal, a word line WL terminal, a scan control line SC terminal, a scan input SI terminal, and a scan output SO terminal, the scannable memory cell comprising:
- an amplifier with an amplifier input and an amplifier output, configured in a positive feedback loop, and wherein the amplifier output is coupled with the scan output SO terminal;
- a first data access switch coupled between the amplifier output and the bit line BL terminal, and with a control terminal coupled with the word line WL terminal; and
- a first scan access switch coupled between the amplifier input and the scan input SI terminal, and with a control terminal coupled with the scan control line SC terminal.

Clause 2. The scannable memory cell of clause 1, further comprising a first scan loop switch coupled in the positive feedback loop between the amplifier input and the amplifier output, and with a control terminal coupled with the scan control line SC terminal.

Clause 3. The scannable memory cell of clause 1 or clause 2, wherein:
- the amplifier comprises a first inverting gate with an input coupled with the amplifier input and with an output coupled with an input of a second inverting gate, wherein the second inverting gate has an output coupled with the amplifier output;
- the scannable memory cell further comprises a complementary bit line /BL terminal; and
- the scannable memory cell further comprises a second data access switch coupled between the output of the first inverting gate and the complementary bit line /BL terminal, and with a control terminal coupled with the word line WL terminal.

Clause 4. The scannable memory cell of any of the clauses 1 to 3, wherein:
- the first inverting gate includes a CMOS inverter;
- the second inverting gate includes a CMOS inverter; and
- the first data access switch, the second data access switch, and the first scan access switch each include a pass transistor.

Clause 5. The scannable memory cell of any of the clauses 1 to 4, wherein the first scan loop switch includes a pass transistor.

Clause 6. The scannable memory cell of any of the clauses 1 to 5, wherein:
- the first scan loop switch is asserted when the scan control line SC terminal is deasserted, and the first scan access switch is asserted when the scan control line SC terminal is asserted.

Clause 7. The scannable memory cell of any of the clauses 1, 3, 5, or 6, wherein the amplifier further comprises a third inverting gate, with an input coupled with the output of the first inverting gate, and with an output coupled with the scan out SO terminal, and wherein the third inverting gate has a drive strength greater than a drive strength of the second inverting gate.

Clause 8. The scannable memory cell of any of the clauses 1 to 7, further comprising:
- a second word line WL2 terminal
- a second bit line BL2 terminal; and
- a second data access switch coupled between the amplifier output and the second bit line BL2 terminal, and with a control terminal coupled with the second word line WL2 terminal.

Clause 9. The scannable memory cell of any of the clauses 1 to 8, further comprising:
- a search line SL terminal;
- a match line ML terminal;
- a combinational logic circuit coupled with the match line ML terminal, and with a first input coupled with the amplifier output and a second input coupled with the search line SL terminal, wherein the combinational logic circuit compares a value of the amplifier output with a value of the search line terminal.

Clause 10. A method of using a scannable memory cell, the scannable memory cell including a buffer, a data access switch controlled by a world line WL, and a scan access switch controlled by a scan control line SC and configured to couple an input of the buffer with a scan input source SI, the method comprising:
- determining a mode from a signal on the scan control line SC and a signal on the word line WL;
- upon determining that the mode is a data access mode, asserting the data access switch to couple the buffer with a bit line BL;
- upon determining that the mode is not a data access mode, deasserting the data access switch to decouple the buffer from the bit line BL;
- upon determining that the mode is a scan mode, asserting the scan access switch to couple the input of the buffer with the scan input source SI; and
- upon determining that the mode is not a scan mode, deasserting the scan access switch to decouple the input of the buffer from the scan input source SI.

Clause 11. The method of clause 10, wherein:
- the scannable memory cell further includes a scan loop switch;
- upon determining that the mode is a scan mode further comprises interrupting a positive feedback loop to decouple a buffer input from a buffer output; and
- upon determining that the mode is not a scan mode further comprises restoring the positive feedback loop to couple the buffer input to the buffer output.

Considerations

We describe various implementations of scannable SRAM cells. This document provides examples of modifications made to conventional SRAM cells to make them scannable. Although the examples focus on implementations in CMOS technology, the same or comparable modifications may be made to SRAM cells that use any other existing transistor technology. Most examples focus on SRAM cells that interface with complementary bit lines, and that use buffers built from two inverting gates to enable the positive feedback loop on which SRAM cells depend, but the modifications may be made to SRAM cells that interface with any number bit lines, and that may include a non-inverting buffer that is not built from successive inverting gates. Where the examples show simple inverters as inverting gates, implementations may use any other inverting gates, including for instance NAND gates and/or NOR gates. The examples show pass transistors as controlled switches. However, implementations may use any other controlled switches. Although most examples include a scan loop switch that can temporarily interrupt the positive feedback loop in the SRAM cell, other techniques may also be used to force a weak latch to change state driven by another equally weak latch. All such variations, and combinations of techniques described herein, are within the scope and ambit of the disclosed technology.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the implementations described herein.

Although the description has been described with respect to specific implementations thereof, these specific implementations are merely illustrative, and not restrictive. The description may reference specific structural implementations and methods and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above. For example, the polarity of assertion of signals may be reversed so that P-type transistors can replace N-type transistors, or vice versa. Many circuits shown are based on CMOS transistors, but implementations may use any transistor technology.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to specific implementations thereof, these specific implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, a coarse-grained reconfigurable architecture (CGRA), or in a programmable logic device such as a field-programmable gate array (FPGA), obviating the need for at least part of any dedicated hardware. Implementations may be as a single chip, or as a multi-chip module (MCM) packaging multiple semiconductor dies in a single package. All such variations and modifications are to be considered within the ambit of the disclosed technology the nature of which is to be determined from the foregoing description.

Any suitable technology for manufacturing electronic devices can be used to implement the circuits of specific implementations, including CMOS, FinFET, GAAFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different specific implementations. In some specific implementations, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

Thus, while specific implementations have been described herein, latitudes of modification, various changes, and substitutions are intended in the foregoing disclosures, and it will be appreciated that in some instances some features of specific implementations will be employed without a corresponding use of other features without departing from the scope and spirit as set forth. Therefore, many modifications may be made to adapt a particular situation or material to the essential scope and spirit.

The invention claimed is:

1. A scannable memory cell, with a bit line BL terminal, a word line WL terminal, a scan control line SC terminal, a scan input SI terminal, and a scan output SO terminal, the scannable memory cell comprising:

an amplifier with an amplifier input and a first amplifier output, configured in a positive feedback loop, and wherein the first amplifier output or a second amplifier output is coupled with the scan output SO terminal;

a first data access switch coupled between the first amplifier output and the bit line BL terminal, and with a control terminal coupled with the word line WL terminal;

a first scan access switch coupled between the amplifier input and the scan input SI terminal, and with a control terminal coupled with the scan control line SC terminal; and a first scan loop switch coupled in the positive feedback loop between the amplifier input and the first amplifier output, and having a control terminal coupled with the scan control line SC terminal.

2. The scannable memory cell of claim 1, wherein:

the amplifier comprises a first inverting gate with an input coupled with the amplifier input and with an output coupled with an input of a second inverting gate, wherein the second inverting gate has an output coupled with the first amplifier output;

the scannable memory cell further comprises a complementary bit line /BL terminal; and the scannable memory cell further comprises a second data access switch coupled between the output of the first inverting gate and the complementary bit line /BL terminal, and with a control terminal coupled with the word line WL terminal.

3. The scannable memory cell of claim 2, wherein:

the first inverting gate includes a CMOS inverter;

the second inverting gate includes a CMOS inverter; and the first data access switch, the second data access switch, and the first scan access switch each include a pass transistor.

4. The scannable memory cell of claim 3, wherein the first scan loop switch includes a pass transistor.

5. The scannable memory cell of claim 4, wherein:

the first scan loop switch is de-asserted when the scan control line SC terminal is asserted, and the first scan access switch is asserted when the scan control line SC terminal is asserted.

6. The scannable memory cell of claim 2, wherein the amplifier further comprises a third inverting gate, with an input coupled with the output of the first inverting gate, and with an output coupled with the second amplifier output, and wherein the third inverting gate has a drive strength greater than a drive strength of the second inverting gate.

7. The scannable memory cell of claim 1, further comprising:

a second word line WL2 terminal;

a second bit line BL2 terminal; and a second data access switch coupled between the first amplifier output and the second bit line BL2 terminal, and with a control terminal coupled with the second word line WL2 terminal.

8. The scannable memory cell of claim 1, further comprising:

a search line SL terminal;

a match line ML terminal; and a combinational logic circuit coupled with the match line ML terminal, and with a first input coupled with the first amplifier output and a second input coupled with the search line SL terminal, wherein the combinational logic circuit compares a value of the first amplifier output with a value of the search line SL terminal.

9. A method of using a scannable memory cell, the scannable memory cell including a buffer, a data access switch controlled by a word line WL, a scan access switch controlled by a scan control line SC and coupled between an input of the buffer and a scan input SI, and a scan loop switch controlled by the scan control line SC and coupled between an output of the buffer and the input of the buffer, the method comprising:

determining a mode from a signal on the scan control line SC and a signal on the word line WL;

upon determining that the mode is a data access mode, asserting the data access switch to couple the buffer with a bit line BL;

upon determining that the mode is not a data access mode, de-asserting the data access switch to decouple the buffer from the bit line BL;

upon determining that the mode is a scan mode, asserting the scan access switch to couple the input of the buffer with the scan input source SI and interrupting a positive feedback loop to decouple a buffer input from a buffer output; and upon determining that the mode is not a scan mode, de-asserting the scan access switch to decouple the input of the buffer from the scan input source SI and restoring the positive feedback loop to couple the buffer input to the buffer output.

* * * * *